United States Patent
Kim et al.

(10) Patent No.: US 8,963,448 B2
(45) Date of Patent: Feb. 24, 2015

(54) OUTPUT BUFFER CIRCUIT, DEVICES INCLUDING THE SAME, AND OPERATING METHOD OF THE OUTPUT BUFFER CIRCUIT

(71) Applicant: Samsung Electronics Co., Ltd., Gyenonggi-do, Suwon-si (KR)

(72) Inventors: Hyung Tae Kim, Hwaseong-si (KR); Soo Ik Cha, Hwaseong-si (KR); Jun Ho Song, Seoul (KR); Jin Chul Choi, Goyang-si (KR); Chul Ho Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 50 days.

(21) Appl. No.: 13/800,077

(22) Filed: Mar. 13, 2013

(65) Prior Publication Data

US 2013/0334985 A1 Dec. 19, 2013

(30) Foreign Application Priority Data

Jun. 13, 2012 (KR) .................. 10-2012-0063164

(51) Int. Cl.
*H03F 3/45* (2006.01)
*G09G 3/22* (2006.01)
*H03F 3/30* (2006.01)
*G09G 3/36* (2006.01)

(52) U.S. Cl.
CPC .............. *H03F 3/45179* (2013.01); *G09G 3/22* (2013.01); *H03F 3/3022* (2013.01); *H03F 3/45475* (2013.01); *H03F 2203/45248* (2013.01); *H03F 2203/45528* (2013.01); *G09G 3/3688* (2013.01); *G09G 2310/0291* (2013.01)

USPC ............................ 315/307; 330/260; 326/83

(58) Field of Classification Search
None
See application file for complete search history.

(56) References Cited

U.S. PATENT DOCUMENTS

| 6,087,853 | A  | * | 7/2000 | Huber et al. .................... 326/83 |
| 6,636,117 | B2 | * | 10/2003 | Sutterlin et al. ............. 330/267 |
| 6,822,632 | B2 |   | 11/2004 | Lee |
| 2007/0152948 | A1 | * | 7/2007 | Chen et al. .................... 345/100 |
| 2010/0033411 | A1 |   | 2/2010 | Lee |

FOREIGN PATENT DOCUMENTS

| JP | 3661651 | 4/2005 |
| KR | 10-20050054215 | 6/2005 |
| KR | 10-20060081037 | 7/2006 |
| KR | 10-20070062134 | 6/2007 |
| KR | 10-20080072377 | 8/2008 |
| KR | 10-20110024152 | 3/2011 |
| KR | 10-20110034796 | 4/2011 |
| KR | 10-20110072064 | 6/2011 |

* cited by examiner

*Primary Examiner* — Crystal L Hammond
(74) *Attorney, Agent, or Firm* — Onello & Mello, LLP

(57) ABSTRACT

An output buffer circuit includes an amplifier and a transmission circuit. The amplifier includes a plurality of inputs and an output. The inputs provide first input signals and second input signals to the amplifier. The output provides an output signal as a first input signal of the first input signals to the amplifier. The transmission circuit has an input coupled to the output of the amplifier and further has an output that provides a transmission circuit output signal as a second input signal of the second input signals to the amplifier.

19 Claims, 9 Drawing Sheets

OUTPUT BUFFER CIRCUIT, DEVICES INCLUDING THE SAME, AND OPERATING METHOD OF THE OUTPUT BUFFER CIRCUIT

CROSS-REFERENCE TO RELATED APPLICATIONS

This application claims the benefit of Korean Patent Application No. 10-2012-0063164, filed on Jun. 13, 2012, in the Korean Intellectual Property Office, the disclosure of which is incorporated herein in its entirety by reference.

FIELD OF THE INVENTION

Embodiments relate to output buffer circuits, and more particularly, to a device that amplifies a difference between input signals and signals fed back via different feedback paths.

BACKGROUND

Conventional liquid crystal displays (LCDs) may display images by adjusting a light transmittance of a liquid crystal having a dielectric anisotropy by an electric field. An LCD may include a color filter substrate having a color filter array formed therein and a thin film transistor substrate having a thin film transistor array formed therein.

A common electrode providing a common voltage may be formed on the color filter substrate. A plurality of pixel electrodes each providing data signals may be formed in a matrix form on the thin film transistor substrate. The thin film transistor substrate may include thin film transistors that individually drive the pixel electrodes, gate lines that control the thin film transistors, and source lines that provide data signals to the thin film transistors.

An LCD driver is a device that drives an LCD, and may include a gate driver that drives gate lines, a source driver that drives source lines, a common voltage generator which provides a common voltage to a common electrode, and a controller that controls the gate driver and the source driver. The source driver may include an output buffer circuit to prevent data signals provided to the source lines from being distorted by load included in the source lines. The output buffer circuit may be part of an operational amplifier.

SUMMARY

According to an aspect of the inventive concept, there is provided an output buffer circuit comprising an amplifier and a transmission circuit. The amplifier includes a plurality of inputs and an output. The inputs provide first input signals and second input signals to the amplifier. The output provides an output signal as a first input signal of the first input signals to the amplifier. The transmission circuit has an input coupled to the output of the amplifier and further has an output that provides a transmission circuit output signal as a second input signal of the second input signals to the amplifier.

In an embodiment, the amplifier amplifies a difference between the first input signals to generate first differential signals, amplifies a difference between the second input signals to generate second differential signals, and outputs from the output of the amplifier the output signal based on the first differential signals and the second differential signals.

In an embodiment, the transmission circuit includes a transmission gate.

In an embodiment, the transmission circuit includes an impedance circuit.

In an embodiment, the first input signal of the first input signals and the second input signal of the second input signals are fed back to negative input terminals of the inputs of the amplifier.

In an embodiment, source driver comprises the output buffer circuit; and a digital-to-analog converter (DAC) which supplies another first input signal of the first input signals and another second input signal of the second input signals to the output buffer circuit.

In an embodiment, the transmission circuit includes a transmission gate.

In an embodiment, the transmission circuit includes an impedance circuit.

In an embodiment, the first input signal of the first input signals and the second input signal of the second input signals are fed back to negative input terminals of the amplifier.

In an embodiment, a display comprising: the output buffer circuit; and a display panel, wherein the display panel comprises a source line that is driven according to a source line driving signal output from the output buffer circuit.

In an embodiment, the transmission circuit includes a transmission gate or an impedance circuit.

In an embodiment, an electronic device comprises the display; and a processor which controls an operation of the display. In an embodiment, the electronic device is a portable device.

According to another aspect of the inventive concept, there is provided a method of operating an output buffer circuit, the method comprising generating first differential signals by amplifying a difference between a first input signal and a first feedback signal fed back from an output buffer; generating second differential signals by amplifying a difference between a second input signal and a second feedback signal fed back from a transmission circuit connected to the output buffer; and generating the first feedback signal in response to the first differential signals and the second differential signals.

DETAILED DESCRIPTION OF THE EMBODIMENTS

Figure 1:
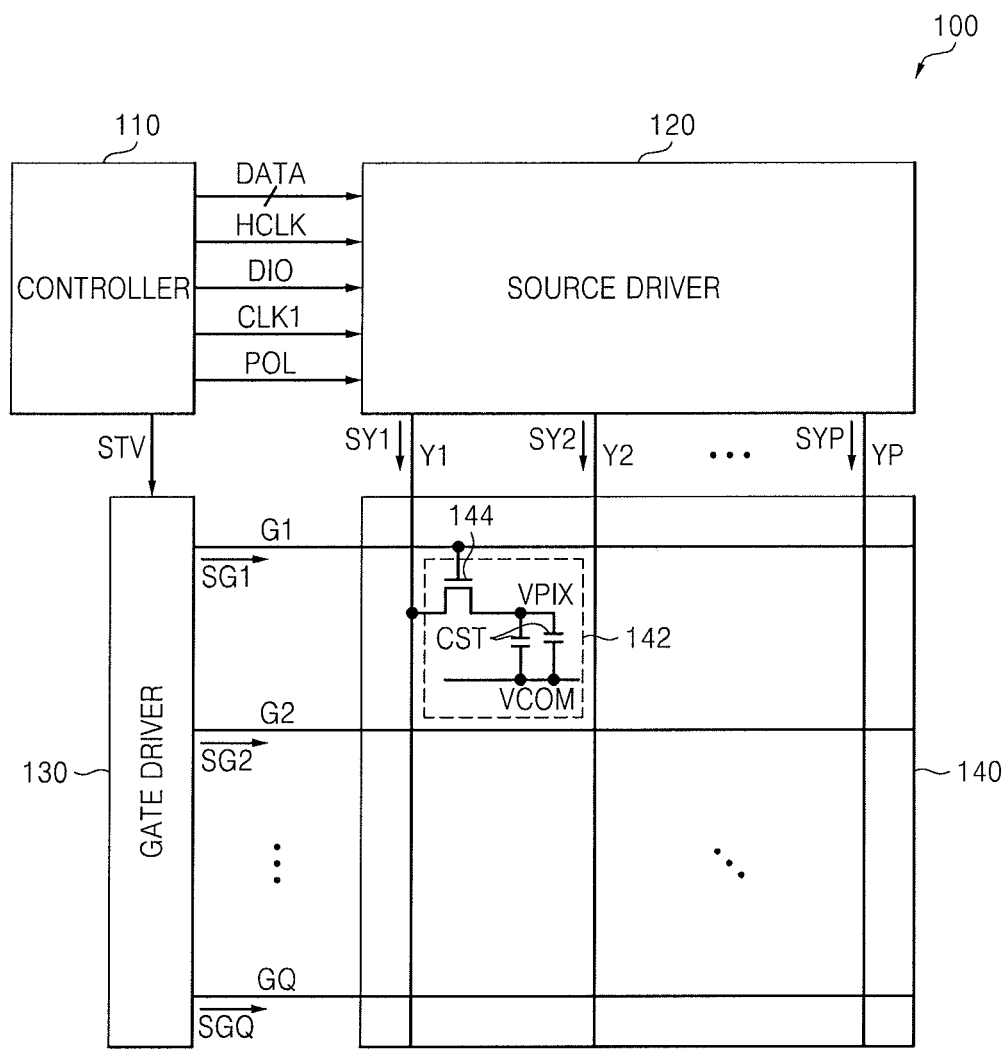
FIG. 1 is a block diagram of a display according to an embodiment.

FIG. 1 is a block diagram of an electronic display 100 according to the inventive concept. Referring to FIG. 1, the electronic display 100 may include a controller 110, a source driver 120, a gate driver 130, and a display panel 140.

According to an embodiment, a display module may include the controller 110, the source driver 120, and the gate driver 130, and may further include the display panel 140.

According to an embodiment, the display panel 140 may be implemented by using a thin film transistor-liquid crystal display (TFT-LCD) panel, a light emitting diode (LED) display panel, an organic LED (OLED) display panel, or an active matrix OLED (AMOLED) display panel.

The controller 110 may generate and output a vertical start signal STV. The controller 110 may also generate one or more output control signals, such as a clock signal HCLK, a horizontal start signal DIO, a first output control signal CLK1, and a polarity control signal POL. The controller 110 may also generate and output digital image data DATA.

The source driver 120 may drive each of a plurality of a plurality of source lines Y1 through YP in response to the output control signals output from the controller 110, namely, the clock signal HCLK, the horizontal start signal DIO, the first output control signal CLK1, and the polarity control signal POL.

According to an embodiment, the source driver 120 may perform a charge sharing operation with respect to the source lines Y1 through YP in response to the first output control signal CLK1. According to another embodiment, the source driver 120 may output analog data signals SY1 through SYP to the source lines Y1 through YP, respectively, in response to the first output control signal CLK1.

The gate driver 130 may sequentially drive a plurality of gate lines GI through GQ in response to the vertical start signal STV received from the controller 110. The gate driver 130 may generate gate line driving signals SG1 through SGQ to drive the gate lines G1 through GQ, respectively.

The display panel 140 may include the source lines Y1 through YP, the gate lines G1 through GQ, and liquid crystal cells 142 that are coupled between the source lines Y1 through YP and the gate lines G1 through GQ.

Each of the liquid crystal cells 142 may include a liquid crystal switch 144 and at least one capacitor CST. The liquid crystal switch 144 can be switched on according to the gate line driving signal SG1 received from the gate driver 130 via the gate line G1. In doing so, the analog data signal SY1 received from the source driver 120 via the source line Y1 may be applied to a pixel electrode VPIX via the liquid crystal switch 144. In this case, as a liquid crystal orientation state of each liquid crystal cell 142 varies due to an electric field generated between the pixel electrode VPIX and a common electrode VCOM, an image may be displayed on the display panel 140.

A capacitor CST may store, or sustain, the analog data signal SY1 applied to the pixel electrode VPIX until the gate line G1 is driven at a next frame.

Figure 2:
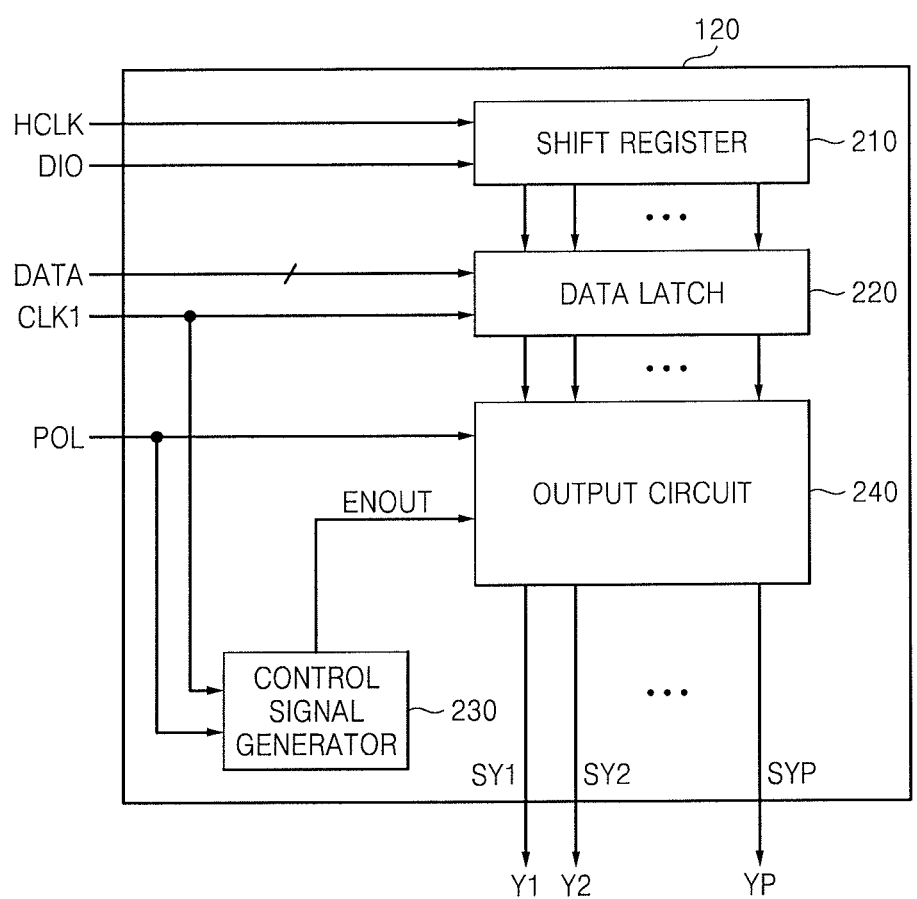
FIG. 2 is a block diagram of a source driver of the display illustrated in FIG. 1 according to an embodiment.

FIG. 2 is a block diagram of the source driver 120 of FIG. 1. As shown in FIG. 2, the source driver 120 may include a shift register 210, a data latch 220, a control signal generator 230, and an output circuit 240.

The shift register 210 may include a plurality of latches (not shown). The latches may sequentially shift the horizontal start signal DIO in response to the clock signal HCLK.

The data latch 220 may receive horizontal start signals from the shift register 210 that correspond to a result of a shifting at the shift register 210. The data latch 220 can store the digital image data DATA in response to the received horizontal start signals. The data latch 220 may output the digital image data DATA in response to the first output control signal CLK1.

The control signal generator 230 may generate a second output control signal ENOUT in response to the first output control signal CLK1 and the polarity control signal POL. The polarity control signal POL may denote a signal for controlling the polarity of each of the analog data signals SY1 through SYP, which can be output to the source lines Y1 through YP, respectively. According to an embodiment, the control signal generator 230 may generate a control signal that controls the charge sharing of the source lines Y1 through YP.

The output circuit 240 may receive the digital image data DATA from the data latch 220, and may transmit the analog data signals SY1 through SYP corresponding to the digital image data DATA to the display panel 140 via the source lines Y1 through YP, respectively, in response to the polarity control signal POL and the second output control signal ENOUT.

Figure 3:
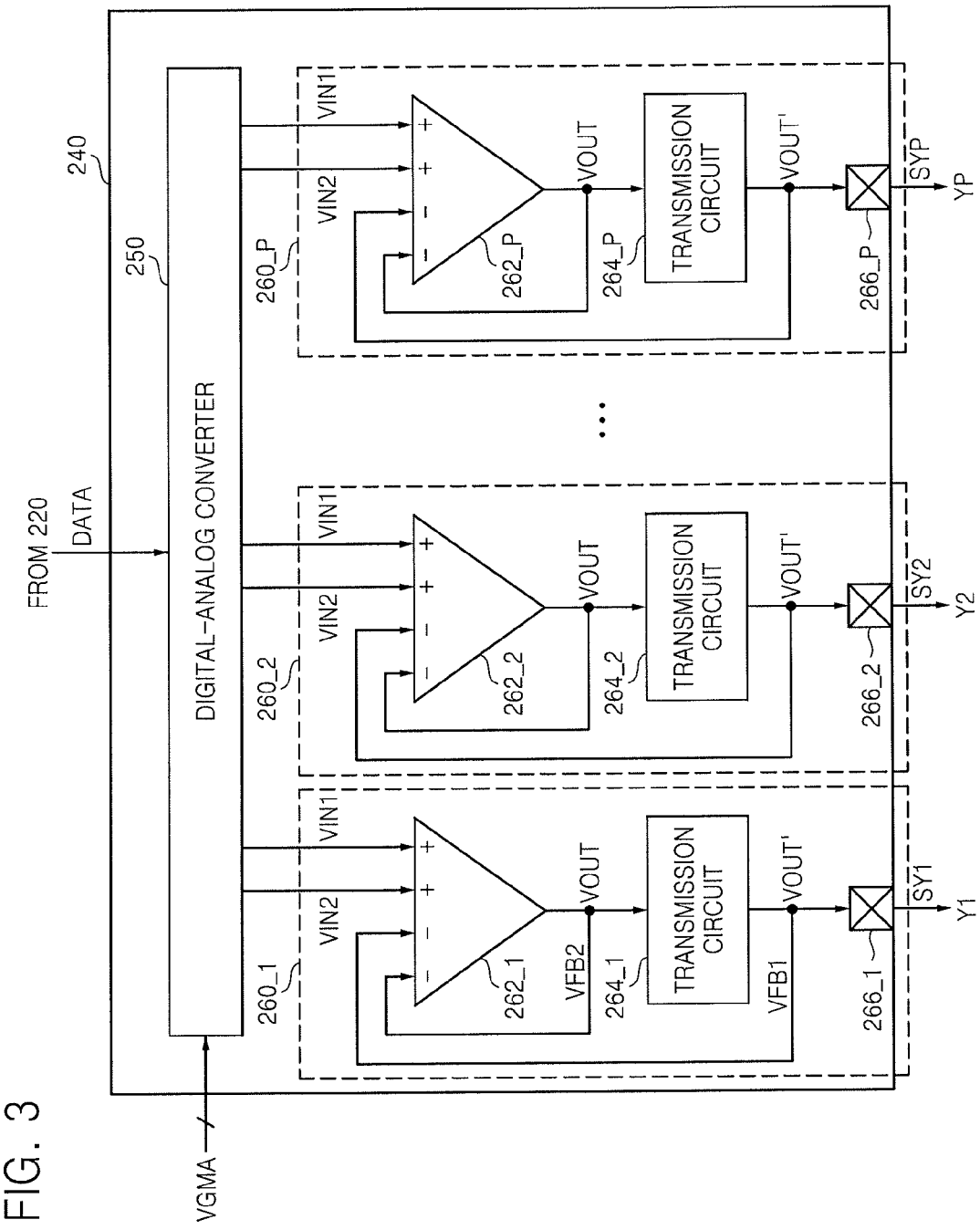
FIG. 3 is a schematic circuit diagram of an output circuit of the source driver illustrated in FIG. 2 according to an embodiment.

FIG. 3 is a schematic circuit diagram of the output circuit 240 of FIG. 2. Referring to FIGS. 2 and 3, the output circuit 240 may include a digital-analog converter (DAC) 250 and a plurality of output buffer circuits 260_1 through 260_P. Here, P is a natural number.

The DAC 250 may generate a first input signal VIN1 and a second input signal VIN2 corresponding to the digital image data DATA output from the data latch 220 to one or more output buffer circuits 260_1 through 260_P in response to a grayscale voltage VGMA. The first input signal VIN1 and the second input signal VIN2 may be analog signals.

The output buffer circuits 260_1 through 260_P may each buffer the first input signal VIN1 and the second input signal VIN2 received from the DAC 250, and may output the analog data signals SY1 through SYP, respectively, in response to the first and second input signals VIN1 and VIN2 and first and second feedback signals VFB1 and VFB2. The first and second input signals VIN1 and VIN2 supplied to each of the output buffer circuits 260_1 through 260_P may have different voltage levels.

According to an embodiment, each of the output buffer circuits 260_1 through 260_P may further include a special circuit (not shown) for preventing an electrostatic discharge. The output buffer circuits 260_1 through 260_P may have substantially the same structures as each other.

The output buffer circuit 260_1 may include an amplifier 262_1, a transmission circuit 264_1, and an output pad 266_1. The amplifier 262_1 may output an output signal VOUT in response to the first and second input signals VIN1, VIN2 received from the DAC 250, the first feedback signal VFB1 received from the transmission circuit 264_1, and the second feedback signal VFB2. In an embodiment, the amplifier 262_1 may be implemented as a multi-input-single-output amplifier.

The transmission circuit 264_1 may transmit the output signal VOUT received from the amplifier 262_1 to the output pad 266_1 so that the output signal VOUT may serve as an output signal VOUT'. The output pad 266_1 may transmit the analog data signal SY1 (=VOUT') to the display panel 140 via the source line Y1 in response to the output signal VOUT' received from the transmission circuit 264_1. The analog data signal SY1 output from the output pad 266_1 may be output, and used, as a source line driving signal.

A structure and an operation of each of the output buffer circuits 260_1 through 260_P will now be described in more detail with reference to FIGS. 4 through 6.

Figure 4:
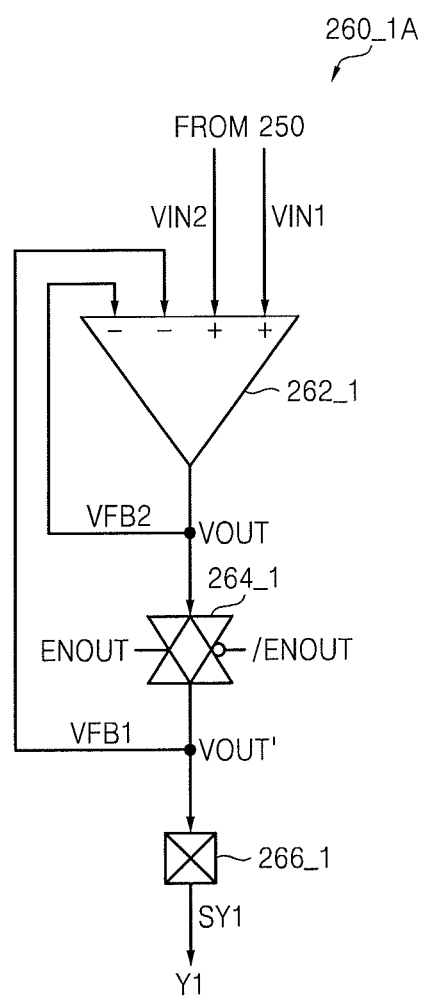
FIG. 4 is a diagram of the output buffer circuit illustrated in FIG. 3 according to an embodiment.

FIG. 4 is a circuit diagram of an output buffer circuit 260_1A which is an embodiment of the output buffer circuit 260_1 of FIG. 3. Referring to FIG. 4, the output buffer circuit 260_1A may include a transmission circuit 264_1 implemented using a transmission gate.

The transmission circuit 264_1 may be switched in response to the second output control signal ENOUT, for example, output from the control signal generator 230 shown in FIG. 2, and an inverted second output control signal/ENOUT obtained by inverting the second output control signal ENOUT. The inverted second output control signal/ENOUT is complementary to the second output control signal ENOUT. For example, when the second output control signal ENOUT is input to an inverter, the inverted second output control signal/ENOUT may be output from the inverter.

As the transmission circuit 264_1 is switched on, the transmission circuit 264_1 may transmit the output signal VOUT received from the amplifier 262_1 to the output pad 266_1 so that the output signal VOUT may serve as the output signal VOUT'=SY1.

The output signal VOUT' may be fed back to a first negative input terminal of the amplifier 262_1 to provide the first feedback signal VFB1, and the output signal VOUT may be fed back to a second negative input terminal of the amplifier 262_1 to provide the second feedback signal VFB2. As illustrated in FIG. 4, the first and second feedback signals VFB1 and VFB2 are fed back via different paths.

Figure 5:
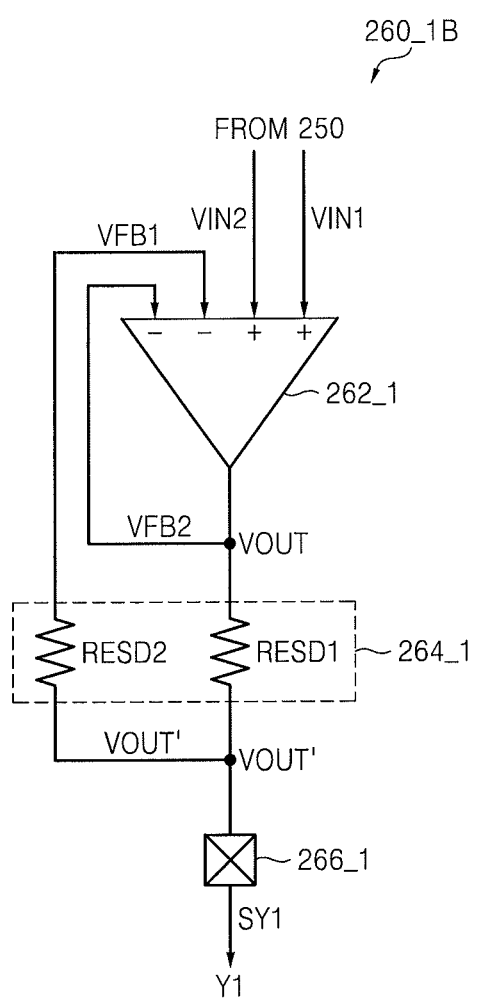
FIG. 5 is another diagram of the output buffer circuit illustrated in FIG. 3 according to an embodiment.

FIG. 5 is a circuit diagram of an output buffer circuit 260_1B according to another embodiment of the output buffer circuit 260_1 of FIG. 3. Referring to FIG. 5, the output buffer circuit 260_1B may include a transmission circuit 264_1.

The transmission circuit 264_1 may include an impedance circuit for preventing electrostatic discharge, which may include a plurality of resistors RESD1 and RESD2. The resistors RESD1 and RESD2 may have the same resistance values or different resistance values. A voltage level of the output signal VOUT'=SY1 may be smaller than that of the output signal VOUT. As illustrated in FIG. 5, the first and second feedback signals VFB1 and VFB2 are fed back via different paths.

Figure 6:
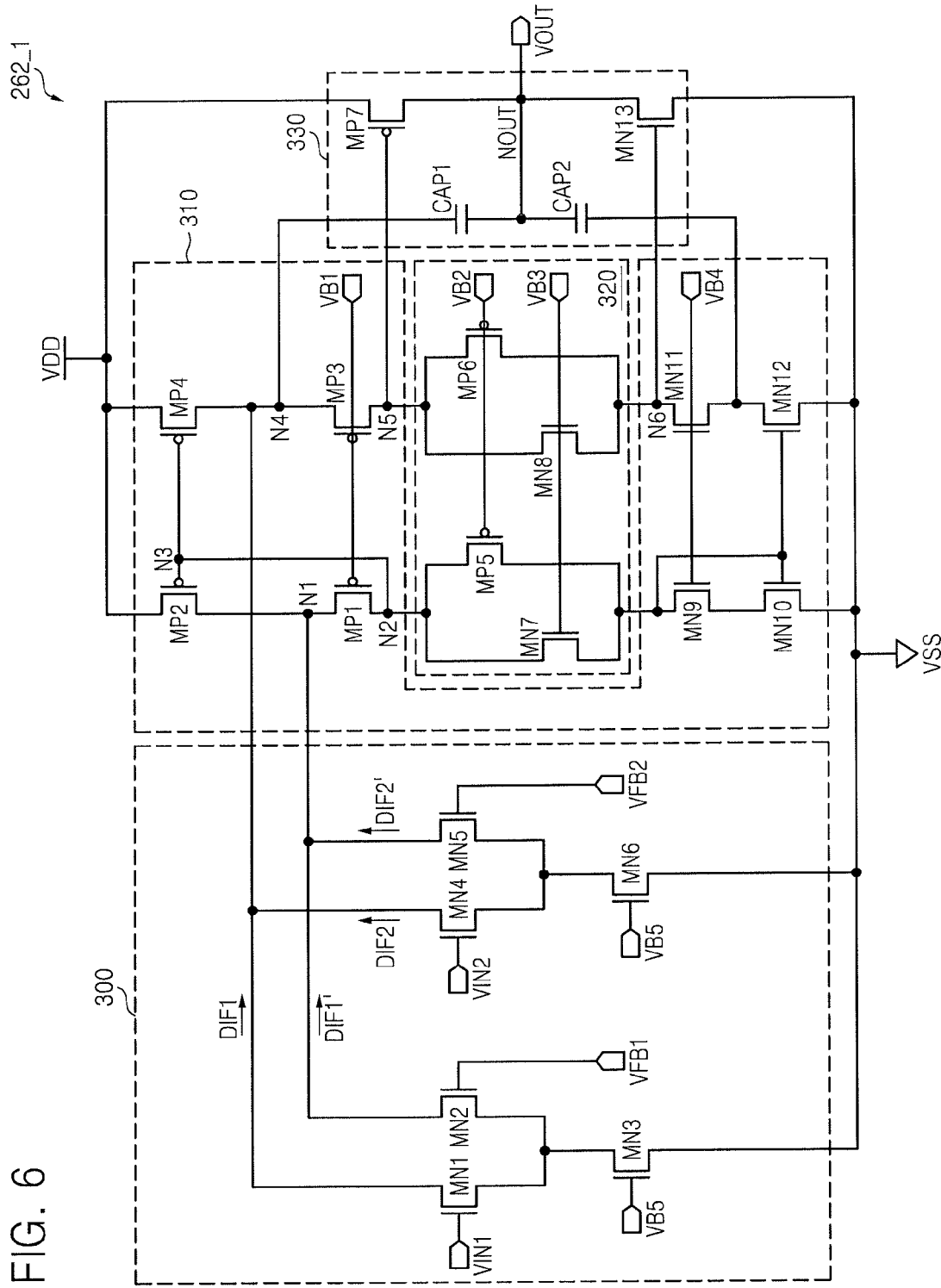
FIG. 6 is a diagram of the amplifier illustrated in FIG. 3 according to an embodiment.

FIG. 6 is a circuit diagram of the amplifier 262_1 of FIG. 3 according to an embodiment. Referring to FIGS. 3 and 6, the amplifier 262_1 may include a differential amplifier 300, a current summation circuit 310, a floating current source 320, and an output driver 330.

The differential amplifier 300 may include first differential transistors MN1 and MN2 connected to a ground VSS via a transistor MN3, and second differential transistors MN4 and MN5 connected to the ground VSS via a transistor MN6. Each of the transistors MN3 and MN6 may be gated according to a fifth bias voltage VB5. Accordingly, during amplification, each of the transistors MN3 and MN6 may operate as a current source according to the fifth bias voltage VB5.

According to an embodiment, a first input signal VIN1 may be supplied to a first positive input terminal, or a third overall input terminal, of the amplifier 262_1, for example, a gate of the first differential transistor MN1, and a second input signal VIN2 may be supplied to a second positive input terminal, or a fourth overall input terminal, of the amplifier 262_1, for example, a gate of the second differential transistor MN4. A first feedback signal VFB1 may be supplied to a first negative input terminal of the amplifier 262_1, for example, a gate of the first differential transistor MN2, and a second feedback signal VFB2 may be supplied to a second negative input terminal of the amplifier 262_1, for example, a gate of the second differential transistor MN5.

The first differential transistors MN1 and MN2 may generate first differential signals DIF1 and DIF1' by amplifying a voltage difference between the first input signal VIN1 and the first feedback signal VFB1, and may output the first differential signals DIF1 and DIF1' to the current summation circuit 310. The second differential transistors MN4 and MN5 may generate second differential signals DIF2 and DIF2' by amplifying a voltage difference between the second input signal VIN2 and the second feedback signal VFB2, and may output the second differential signals DIF2 and DIF2' to the current summation circuit 310.

The current summation circuit 310 may include first mirror transistors MP1 through MP4 having a current mirror structure, and second mirror transistors MN9 through MN12 forming having a current mirror structure. The first mirror transistors MP1 and MP3 may be gated by a first bias voltage VB1. The second mirror transistors MN9 and MN11 may be gated by a fourth bias voltage VB4.

The floating current source 320 may be connected between the first mirror transistors MP1 through MP4 and the second mirror transistors MP9 through MP12.

The floating current source 320 may include a plurality of transistors MP5, MP6, MN7, and MN8. The transistors MP5 and MP6 may be gated by a second bias voltage VB2. The transistors MN7 and MN8 may be gated by a third bias voltage VB3. The floating current source 320 may supply a floating current to the current summation circuit 310. Accordingly, the floating current source 320 may serve as a current bias circuit.

The output driver 330 may include a plurality of capacitors CAP1 and CAP2 for preventing oscillation of the output signal VOUT. The output driver 330 may also include a pull-up circuit MP7 and a pull-down circuit MN13. When the pull-up circuit MP7 is implemented by using a PMOS pull-up transistor, the PMOS pull-up transistor MP7 may be connected between a power supply node for supplying a power supply voltage VDD and an output node NOUT and may be gated according to a voltage level of a node N5. According to an embodiment, the pull-up circuit MP7 may include an NMOS pull-up transistor. When the pull-down circuit MN13 includes an NMOS pull-down transistor, the NMOS pull-down transistor MN13 may be connected between the output node NOUT and a ground VSS for supplying a ground voltage and may be gated according to a voltage level of a node N6.

The output driver 330 may output a voltage of the output node NOUT as the output signal VOUT.

Figure 7:
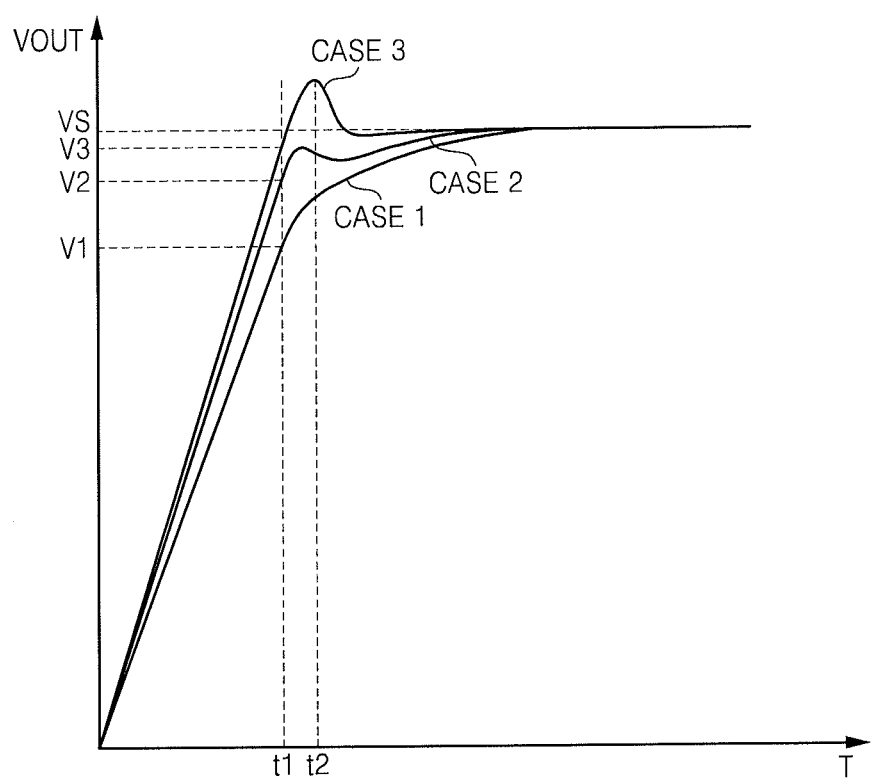
FIG. 7 is a waveform diagram of an output signal of each of the output buffer circuits illustrated in FIG. 3 for each feedback path according to an embodiment.

FIG. 7 is a waveform diagram of the output signal VOUT of the output buffer circuits illustrated in FIG. 3 for each feedback path. FIG. 7 illustrates waveforms of the output signal VOUT in three cases, namely, first through third cases CASE 1 through CASE 3.

For convenience of explanation, it is assumed that a voltage VOUT of an output terminal of the amplifier 262_1 is 9V and a voltage VOUT' of an output terminal of the transmission circuit 264_1 is 8V.

In the first case CASE 1, it is assumed that both the first feedback signal VFB1 and the second feedback signal VFB2 are fed from the output terminal of the amplifier 262_1 back to the amplifier 262_1. In this case, a voltage of each of the first feedback signal VFB1 and the second feedback signal VFB2 is 9V.

The second case CASE 2 can correspond to a waveform of the output signal VOUT of the amplifier 262_1 according to the inventive concept. The first feedback signal VFB1 is fed from the output terminal of the transmission circuit 264_1 back to the first negative input terminal of the amplifier 262_1. The second feedback signal VFB2 is fed from the output terminal of the amplifier 262_1 back to the second negative input terminal of the amplifier 262_1. In this case, a voltage of the first feedback signal VFB1 is 8V and a voltage of the second feedback signal VFB2 is 9V. In the second case CASE 2, as compared with the first case CASE 1, a current flowing via the first differential transistor MN2 decreases when a decrease occurs in the voltage of the first feedback signal VFB1.

Accordingly, the respective voltages of nodes N1, N2, and N3 illustrated at FIG. 6 can increase. As the voltage of the node N3 increases, a current flowing via the first mirror transistor MP4 decreases, and a potential of each of the nodes N4 and N5 decreases.

As the voltage of the node N5 decreases, a current flowing via the pull-up transistor MP7 increases, and the voltage VOUT of the output node NOUT increases. Accordingly, the voltage VOUT as the output signal VOUT in the second case CASE 2 may increase faster than that in the first case CASE 1.

In the third case CASE 3, it is assumed that both the first feedback signal VFB1 and the second feedback signal VFB2 are fed from the output terminal of the transmission circuit 264_1 back to negative input terminals of the amplifier 262_1, respectively. In this case, a voltage of each of the first feedback signal VFB1 and the second feedback signal VFB2 is 8V.

In the third case CASE 3, as compared with the second case CASE 2, a current flowing via the second differential transistor MN5 decreases with a decrease in the voltage of the second feedback signal VFB2. Accordingly, a voltage of each of the nodes N1, N2, and N3 increases. As the voltage of the node N3 increases, a current flowing via the first mirror transistor MP4 decreases, and a potential of each of the nodes N4 and N5 decreases.

As the voltage of the node N5 decreases, the current flowing via the pull-up transistor MP7 increases, and the voltage of the output node NOUT increases. Accordingly, the voltage VOUT as the output signal VOUT in the third case CASE 3 may increase faster than that in the second case CASE 2. However, as illustrated in FIG. 7, an overshoot in the third case CASE3 can be greater than that in the second case CASE2.

Referring to FIG. 7, a voltage of the output signal VOUT at a first point of time t1 in the first case CASE 1 is a first voltage V1, a voltage of the output signal VOUT at the first point of time t1 in the second case CASE 2 is a second voltage V2 (>V1), and a voltage of the output signal VOUT at the first point of time t1 in the third case CASE 3 is a third voltage V3 (>V2).

The voltages of the output signal VOUT at the first point of time t1 in the first, second, and third cases CASE 1, CASE 2, and CASE 3, respectively, increase in a specific order, namely, the third case CASE 3, then the second case CASE 2, and finally the first case CASE 1. As illustrated in FIG. 7, the capability of quickly increasing a voltage, that is, an overdriving capability, is greater in the third case CASE 3 than in the first and second cases CASE 1 and CASE 2.

However, in the third case CASE 3, an overshoot in which the voltage of the output signal VOUT at a second point of time t2 exceeds a settling voltage VS occurs. However, in the second case CASE 2, a voltage of the output signal VOUT at the second point of time t2 does not exceed the settling voltage VS. In other words, little or no overshooting occurs in the second case CASE 2.

In other words, an output buffer circuit according to the inventive concept, for example, the second case CASE 2, has a higher overdriving capability than the first case CASE 1 and can prevent an overshoot occurring in the third case CASE 3.

Figure 8:
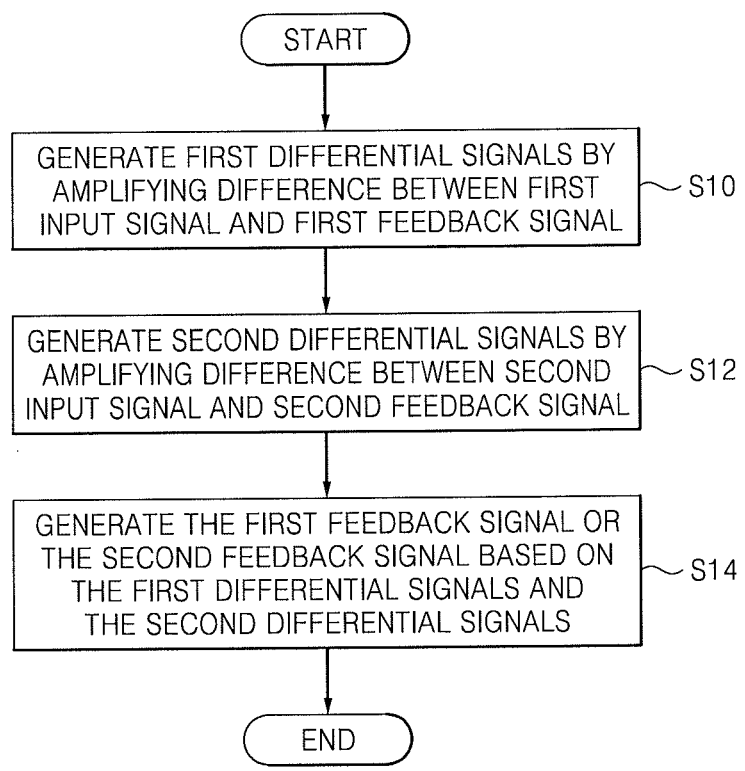
FIG. 8 is a flowchart of an operation of each of the output buffer circuits illustrated in FIG. 3 according to an embodiment.

FIG. 8 is a flowchart of an operation of the output buffer circuit 260_1 illustrated in FIG. 3.

Referring to FIGS. 3, 6, and 8, the differential amplifier 300 may generate the first differential signals DIF1 and DIF1' by amplifying a difference between the first input signal VIN1 and the first feedback signal VFB1, in operation S10. In operation S12, the differential amplifier 300 may generate the second differential signals DIF2 and DIF2' by amplifying a difference between the second input signal V1N2 and the second feedback signal VFB2. In an embodiment, the operations S10 and S12 are simultaneously performed.

As described above, the current summation circuit 310, the floating current source 320, and the output driver 330 of the amplifier 262_1 may generate the output signal VOUT based on a current generated according to the first differential signals DIF1 and DIF 1' and the second differential signals DIF2 and DIF2'. The transmission circuit 264_1 may generate the first feedback signal VFB1 based on the output signal. Accordingly, in operation S14, the first feedback signal VFB1 or the second feedback signal VFB2 may be generated based on the first differential signals DIF1 and DIFF and the second differential signals DIF2 and DIF2'.

Figure 9:
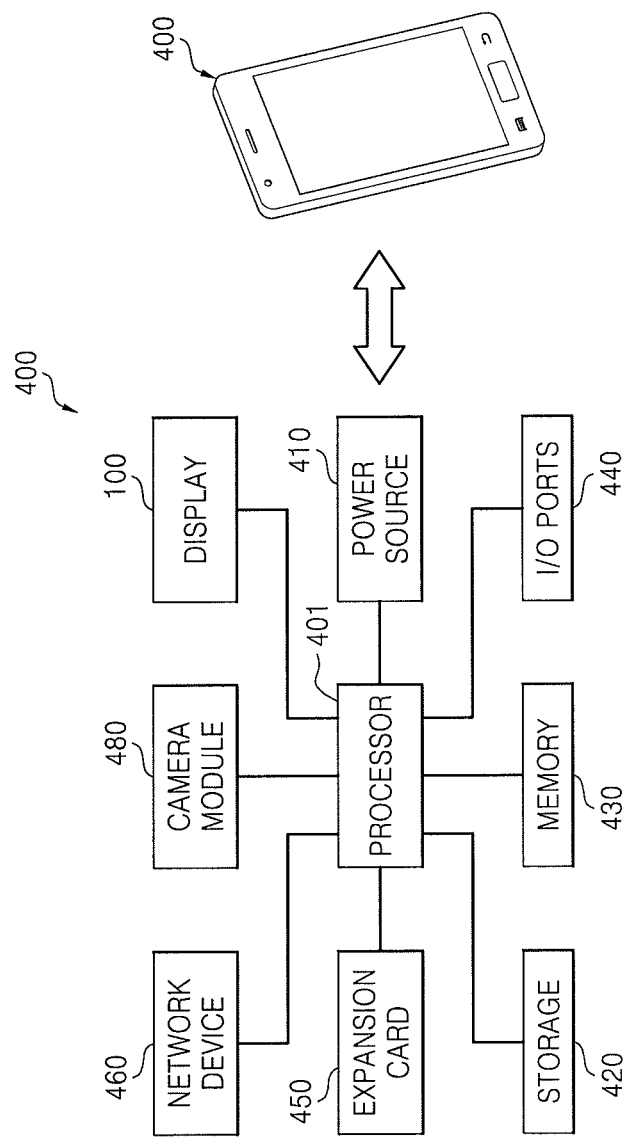
FIG. 9 is a block diagram of an electronic device including the display of FIG. 1, according to an embodiment.

FIG. 9 is a block diagram of an electronic device 400 including the display 100 of FIG. 1, according to the inventive concept.

The electronic 400 may be used as a personal computer (PC) or a portable device. The portable device may be implemented ins a laptop computer, a mobile telephone, a smart phone, a tablet PC, a personal digital assistant (PDA), an enterprise digital assistant (EDA), a digital still camera, a digital video camera, a portable multimedia player (PMP), a personal (or portable) navigation device (PND), a handheld game console, or an e-book reader.

In addition to the display 100, the electronic device 400 includes a processor 401, a power source 410, a storage device 420, a memory 430, input/output (I/O) ports 440, an expansion card 450, a network device 460. According to an embodiment, the electronic device 400 may further include a camera module 480.

The processor 401 may be implemented by using an integrated circuit (IC) or a System on Chip (SoC). The processor 401 may control the operation of at least one of the elements 100 and 410-480.

The power source 410 may generate and provide an operational voltage to at least one of the elements 100 and 410-480. The storage device 420 may include a hard disk drive or a solid state drive (SSD).

The memory 430 may include a volatile memory or a non-volatile memory. In an embodiment, a memory controller capable of controlling a data access operation, for example, a read operation, a write operation (or a program operation), or an erase operation, with respect to the memory 430 may be integrated into or embedded in the processor 401. In another embodiment, the main controller may be installed between the processor 401 and the memory 430.

The I/O ports 440 denote ports capable of transmitting data to the electronic device 400 or data output from the electronic device 400 to an external device. For example, the I/O ports 440 may be a port for connecting a pointing device, for example, a computer mouse, to the electronic device 400, a port for connecting a printer to the electronic device 400, and a port for connecting a USB drive to the electronic device 400.

The expansion card 450 may include a secure digital (SD) card or a multimedia card (MMC). In some cases, the expansion card 450 may be a Subscriber Identification Module (SIM) card or a Universal Subscriber Identity Module (USIM) card.

The network device 460 denotes a device capable of connecting the electronic device 400 to a wired or wireless network.

The display 100 may display data output from the storage device 420, the memory 430, the I/O ports 440, the expansion card 450, or the network device 460. A structure and an operation of the display 100 are the same as or similar to those described with reference to FIGS. 1-8.

The camera module 480 denotes a module capable of converting an optical image into an electrical image. Accordingly, an electrical image output from the camera module 480 may be stored in the storage 420, the memory 430, or the expansion card 450. The electrical image output from the camera module 480 may be displayed on the display 100.

In an output buffer circuit according to the inventive concept, an output signal of the output buffer circuit is fed back to the output buffer circuit via different feedback paths. Therefore, larger overdriving can be obtained in the output buffer circuit according to the inventive concept than in the case where a plurality of feedback paths are all formed from an output terminal of an amplifier to the output buffer circuit. Moreover, the output buffer circuit according to the inventive concept may obtain an overdriving effect and prevent overshooting from occurring, in contrast with the case where all of a plurality of feedback paths are formed from an output terminal of a transmission circuit to the output buffer circuit.

While the inventive concept has been particularly shown and described with reference to exemplary embodiments thereof, it will be understood that various changes in form and details may be made therein without departing from the spirit and scope of the following claims.

What is claimed is:

1. An output buffer circuit comprising:
a single amplifier that includes a plurality of input terminals and an output, the input terminals providing first input signals and second input signals to the amplifier, wherein the output provides an output signal as a first input signal of the first input signals to a first input terminal of the plurality of input terminals of the amplifier; and
a transmission circuit having an input coupled to the output of the amplifier and further having an output that provides a transmission circuit output signal as a second input signal of the second input signals to a second input terminal of the plurality of input terminals of the amplifier.

2. The output buffer circuit of claim 1, wherein the amplifier amplifies a difference between the first input signals to generate first differential signals, amplifies a difference between the second input signals to generate second differential signals, and outputs from the output of the amplifier the output signal based on the first differential signals and the second differential signals.

3. The output buffer circuit of claim 1, wherein the transmission circuit includes a transmission gate.

4. The output buffer circuit of claim 1, wherein the transmission circuit includes an impedance circuit.

5. The output buffer circuit of claim 1, wherein the first input signal of the first input signals and the second input signal of the second input signals are fed back to negative input terminals of the input terminals of the amplifier.

6. A source driver comprising:
the output buffer circuit of claim 1; and
a digital-to-analog converter (DAC) which supplies another first input signal of the first input signals and another second input signal of the second input signals to the output buffer circuit.

7. The source driver of claim 6, wherein the transmission circuit includes a transmission gate.

8. The source driver of claim 6, wherein the transmission circuit includes an impedance circuit.

9. The source driver of claim 6, wherein the first input signal of the first input signals and the second input signal of the second input signals are fed back to negative input terminals of the input terminals of the amplifier.

10. A display comprising:
the output buffer circuit of claim 1; and
a display panel,
wherein the display panel comprises a source line that is driven according to a source line driving signal output from the output buffer circuit.

11. The display of claim 10, wherein the transmission circuit includes a transmission gate or an impedance circuit.

12. An electronic device comprising:
the display of claim 10; and
a processor which controls an operation of the display.

13. The electronic device of claim 12, wherein the electronic device is a portable device.

14. A method of operating an output buffer circuit, the method comprising:
generating first differential signals by amplifying a difference between a first input signal and a first feedback signal fed back from a single output buffer, the single output buffer including a plurality of input terminals and an output, the first input signal fed back from the output of the output buffer to a first input terminal of the output buffer;
generating second differential signals by amplifying a difference between a second input signal and a second feedback signal fed back from a transmission circuit connected to the output buffer, the second input signal input to a second input terminal of the plurality of input terminals; and
generating the first feedback signal in response to the first differential signals and the second differential signals.

15. An output buffer circuit comprising:
a single amplifier that includes a plurality of inputs and an output;
a transmission circuit having an input coupled to the output of the amplifier, and further having a transmission circuit output;
a first feedback path coupled between the output of the amplifier and a first input of the plurality of inputs of the amplifier; and
a second feedback path coupled between the transmission circuit output and a second input of the plurality of inputs of the amplifier, wherein the amplifier amplifies a difference between an input signal received at a third input of the plurality of inputs of the amplifier and a first feedback signal received from the first feedback path at the first input of the plurality of inputs of the amplifier to generate first differential signals, wherein the amplifier amplifies a difference between an input signal received at a fourth input of the plurality of inputs of the amplifier and a second feedback signal received from the second feedback path at the second input of the plurality of inputs of the amplifier generate second differential signals, and wherein the amplifier outputs an output signal from the output of the amplifier in response to the generated first and second differential signals.

16. The output buffer circuit of claim 15, wherein the first feedback signal and the second feedback signal are fed back to negative input terminals of the inputs of the amplifier.

17. The output buffer circuit of claim 15, wherein the first feedback signal is the output signal output from the amplifier, and wherein the second feedback signal is an output signal output from the transmission circuit output.

18. The output buffer circuit of claim 15, wherein the transmission circuit includes a transmission gate.

19. The output buffer circuit of claim 15, wherein the transmission circuit includes an impedance circuit.

* * * * *